United States Patent
Sonohara et al.

(10) Patent No.: US 7,541,683 B2
(45) Date of Patent: Jun. 2, 2009

(54) SEMICONDUCTOR INTEGRATED CIRCUIT DEVICE

(75) Inventors: Hideo Sonohara, Kanagawa (JP); Taro Sakurabayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 137 days.

(21) Appl. No.: 11/723,827

(22) Filed: Mar. 22, 2007

(65) Prior Publication Data

US 2007/0222082 A1 Sep. 27, 2007

(30) Foreign Application Priority Data

Mar. 23, 2006 (JP) .............................. 2006-081347

(51) Int. Cl.
H01L 29/40 (2006.01)
(52) U.S. Cl. ...................................... 257/786; 257/692
(58) Field of Classification Search ................ 257/786, 257/692
See application file for complete search history.

(56) References Cited

U.S. PATENT DOCUMENTS 5,384,487 A * 1/1995 Rostoker et al. ............ 257/786
7,049,642 B2 5/2006 Shinjo
7,259,467 B2 * 8/2007 Inagawa ..................... 257/784
7,323,788 B2 * 1/2008 Miyaki et al. ............... 257/784
2005/0035468 A1 * 2/2005 Andreini et al. ............. 257/786

FOREIGN PATENT DOCUMENTS

JP 2005-93575 4/2005

* cited by examiner

Primary Examiner—Roy K Potter
(74) Attorney, Agent, or Firm—Young & Thompson

(57) ABSTRACT

A semiconductor integrated circuit device of improved wireability, fewer number of wiring layers and strengthened power supply includes a plurality of power pads placed on a semiconductor chip and a plurality of signal pads placed on the semiconductor chip and configured to have a width less than that of the power pads. The signal pads and the power pads are placed in the uppermost wiring layer among a plurality of wiring layers. Signal wiring connecting I/O cells and signal pads is disposed in the uppermost wiring layer. First power wiring electrically connecting the I/O cells and first power pads is disposed in the uppermost wiring layer. Second power wiring connecting internal circuits and second power pads is disposed in the uppermost wiring layer.

18 Claims, 5 Drawing Sheets

(X–X′)

(Y–Y′)

SEMICONDUCTOR INTEGRATED CIRCUIT DEVICE

FIELD OF THE INVENTION

This invention relates to a semiconductor integrated circuit device and, more particularly, to a semiconductor integrated circuit device in which a plurality of power pads and signal pads are disposed on a semiconductor integrated circuit chip.

BACKGROUND OF THE INVENTION

A semiconductor integrated circuit device usually has plurality of insulating layers and a plurality of wiring layers build up alternatingly on a semiconductor integrated circuit chip. The wiring layers are interconnected by vias, and a plurality of power pads and a plurality of signal pads are disposed on the uppermost wiring layer among the wiring layers. The IC chip has an internal circuit or circuits placed in an internal area, and a plurality of I/O cells (I/O buffers) disposed peripheral to or in close proximity thereto. The internal circuits are electrically connected to corresponding I/O cells through wiring, and the I/O cells are electrically connected to the signal pads and power pads through wiring. The signal pads and power pads are electrically connected to the exterior of the IC chip.

In such a semiconductor integrated circuit device disclosed heretofore, a single power pad (PVDD, PGND) and a plurality of I/O cells disposed on an IC chip are connected by respective ones of a plurality of independent wiring traces (H2, HD, H1) of identical thickness, the plurality of I/O cells are connected to corresponding signal pads (PSIG) by respective ones of independent wiring traces (HS), and the signal pads (PSIG) are arrayed in the area between the power pad and the plurality of I/O cells (see FIG. 6, Patent Document 1). Such an arrangement has the advantage of high packing density and enables the degree of freedom of layout design to be raised without the formation of thick power wiring.

[Patent Document 1] Japanese Patent Kokai Publication No. JP-P2005-93575A (FIG. 3)

SUMMARY OF THE DISCLOSURE

The above mentioned Patent Document is herein incorporated by reference thereto.

However, this conventional semiconductor integrated circuit device has certain problems. The following analyses are given by the present invention.

A first problem is risk of an increase in the number of wiring layers on the IC chip. More specifically, in the conventional semiconductor integrated circuit device, the size of the signal pad (PSIG) is large, just as is the size of the power pad (PVDD, PGND), and hence the area in which it is possible to perform wiring in the uppermost wiring layer is diminished (i.e., wiring sources are diminished). Consequently, there is the danger that the wiring layers will increase by two for the signal-pad wiring (HS) and power-pad wiring (H2, HD, H1).

A second problem is risk of a decline in wireability (freedom of wiring). More specifically, in the conventional semiconductor integrated circuit device, the power pad (PVDD, PGND) is disposed remote from the I/O cells. Therefore, in order to lower the resistance (strengthen) the wiring (H2, HD, H1) for the power pad, there is an increase in the number of wiring traces. This has the risk of diminishing wireability.

A third problem is risk of a decline in degree of freedom regarding placement of macros such as internal circuits in the area underlying the signal pads. More specifically, in the conventional semiconductor integrated circuit device, the power wiring (HD) electrically connecting the I/O cells and power pad (PVDD, PGND) is disposed below the signal pads (PSIG). Consequently, it may be difficult to dispose a macro, which uses an (n−1)th wiring layer, below the signal pad (PSIG) in the uppermost wiring layer (nth wiring layer).

A fourth problem is risk of an increase in the voltage drop of the power source of the internal circuits. More specifically, in the conventional semiconductor integrated circuit device, the power wiring (HD) connecting the I/O cells and the power pad is disposed directly below the signal pads (PSIG). Consequently, power wiring density for supplying the internal circuits declines and resistance increases.

Accordingly, it is an object of the present invention to enable an improvement in wireability in a semiconductor integrated circuit device, a reduction in number of wiring layers and strengthening of the power supply.

According to a first aspect of the present invention, there is provided a semiconductor integrated circuit device comprising a plurality of power pads laid out on a semiconductor chip; and a plurality of signal pads laid out on the semiconductor chip and configured to have a width less than that of the power pads.

The following modes may be implemented according to the present invention.

The power pads may be square pads and the signal pads are rectangular pads.

The semiconductor chip may have I/O cells and internal circuits; the power pads include first power pads for the I/O cells and second power pads for the internal circuits; the first power pads are placed on or in the vicinity of the I/O cells; and the second power pads are placed on the internal circuits.

The internal circuits may be placed at the center of the semiconductor chip, and the I/O cells are placed in the vicinity of an outer edge of the semiconductor chip.

The signal pads and the power pads may be placed in an uppermost wiring layer among a plurality of wiring layers.

At least one portion of signal wiring electrically connecting the I/O cells and the signal pads may be placed in the uppermost wiring layer.

At least one portion of first power wiring electrically connecting the I/O cells and the first power pads may be placed in the uppermost wiring layer.

At least one portion of second power wiring electrically connecting the internal circuits and the second power pads may be placed in the uppermost wiring layer.

The signal pads may be placed in order starting from the vicinity of the outer edge of the semiconductor chip while the first power pads are avoided.

The device may further comprise a plurality of bumps disposed on respective ones of the power pads and the signal pads; wherein the bumps are approximately the same in size.

The portion of the first power wiring placed in the uppermost wiring layer may be routed along the outer edge of the semiconductor chip; and at least some of the signal pads are pads that are placed on the I/O cells and that have a width of diminished size in a direction at right angles to the outer edge of the semiconductor chip.

At least a portion of the second power wiring placed in the uppermost wiring layer may be routed in a direction at right angles to the outer edge of the semiconductor chip; and at least some of the signal pads are pads that are placed between wiring traces of the second power wiring on the internal circuits and that have a width of diminished size in a direction parallel to the outer edge of the semiconductor chip.

The device may further comprise a pair of power wiring traces routed in parallel in the same direction from both ends of two opposing sides of one power pad from among the plurality of power pads; wherein the plurality of signal pads include a first signal pad interposed between the pair of power wiring traces; and the first signal pad has a width that is smaller than spacing between the first pair of power wiring traces.

The plurality of signal pads may include a second signal pad interposed between one wiring trace among the pair of power wiring traces and placed in an area that does not interfere with the first signal pad; the second signal pad is connected to second signal wiring; the plurality of power pads, the first and second signal pads, the pair of power wiring traces and the second signal wiring are arranged using the same wiring layer; and the second signal wiring is a wiring that passes between the first signal pad and the pair of power wiring traces.

The spacing between the pair of power wiring traces may be less than a spacing between the two opposing sides of the power pad The meritorious effects of the present invention are summarized as follows.

In accordance with the present invention (claims 1 to 15), pads of optimum sizes are employed in accordance with amount of current passed. Therefore, by optimizing layout of pads of different sizes, it is possible to improve wireability of the uppermost wiring layer, reduce the number of wiring layers and strengthen the power supply.

Other features and advantages of the present invention will be apparent from the following description taken in conjunction with the accompanying drawings, in which like reference characters designate the same or similar parts throughout the figures thereof.

PREFERRED MODES OF THE INVENTION

First Example

Figure 1:
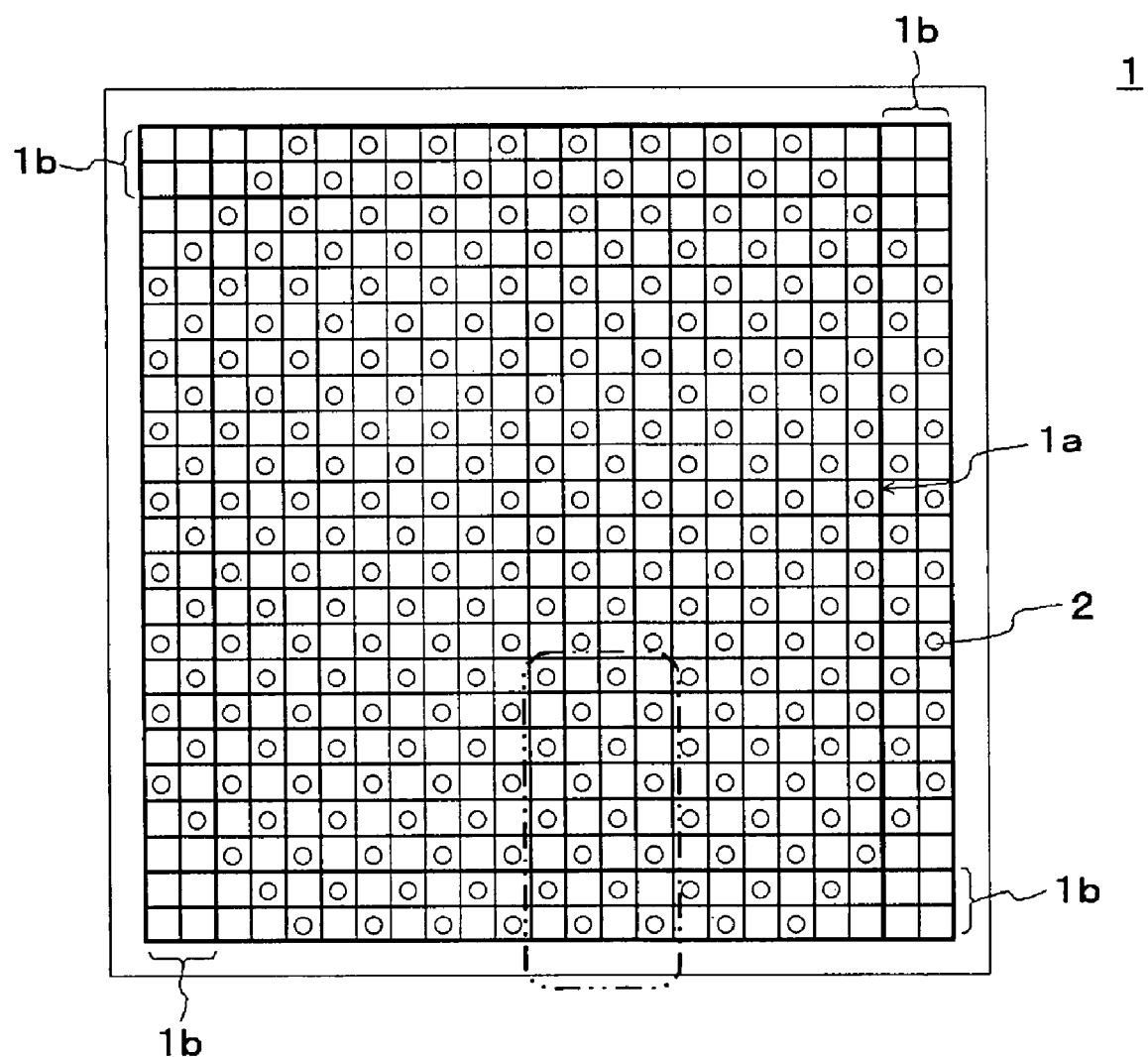
FIG. 1 is a plan view schematically illustrating a bump layout surface of a semiconductor integrated circuit device according to a first example of the present invention.

A semiconductor integrated circuit device according to a first example of the present invention will now be described. FIG. 1 is a plan view schematically illustrating a bump layout surface of a semiconductor integrated circuit device according to a first example of the present invention, FIG. 2 is a partially enlarged plan view schematically illustrating pads and wiring patterns in a region enclosed by a phantom line in the semiconductor integrated circuit device according to the first example, FIG. 3 is a partial plan view schematically illustrating only patterns of an uppermost wiring layer of the semiconductor integrated circuit device according to the first example, FIG. 4 is a partial sectional view taken along line X-X' of FIG. 2 schematically illustrating the semiconductor integrated circuit device according to the first example, and FIG. 5 is a partial sectional view taken along line Y-Y' of FIG. 2 schematically illustrating the semiconductor integrated circuit device according to the first example.

A semiconductor integrated circuit device 1 is a semiconductor chip having internal circuits and I/O cells. As illustrated in FIG. 1, bumps (soldering holes) 2 are disposed on a bump layout surface of the semiconductor integrated circuit device 1 at locations indicated by the circle marks on the grid. Pads (not shown) are placed below the bumps 2. The bump layout surface has an internal circuit area 1a disposed at the center of the surface and an I/O cell area 1b in the proximity of (or surrounding) the internal circuit area 1a. The internal circuit area 1a is an area in which a plurality of internal circuits (not shown) are placed within the semiconductor integrated circuit device 1. The I/O cell area 1b is an area in which a plurality of I/O cells (not shown) are placed within the semiconductor integrated circuit device 1. The semiconductor integrated circuit device 1 has a multi-layered wiring arrangement in which a plurality of insulating layers 3, 5 and 8 (FIGS. 4 and 5) and a plurality of wiring layers 4 and 7 (FIGS. 4 and 5) are built up alternatingly on a semiconductor substrate 10 (FIGS. 4 and 5), with the wiring layers (not shown) being connected by vias. It should be noted that the pattern of the internal circuit area 1a and I/O cell area 1b illustrated in FIG. 1 is one example, and a plurality of sets of internal circuit areas and I/O cell areas may be laid out. Pads and wiring patterns in a region enclosed by a phantom line in FIG. 1 are illustrated in FIG. 2.

Figure 2:
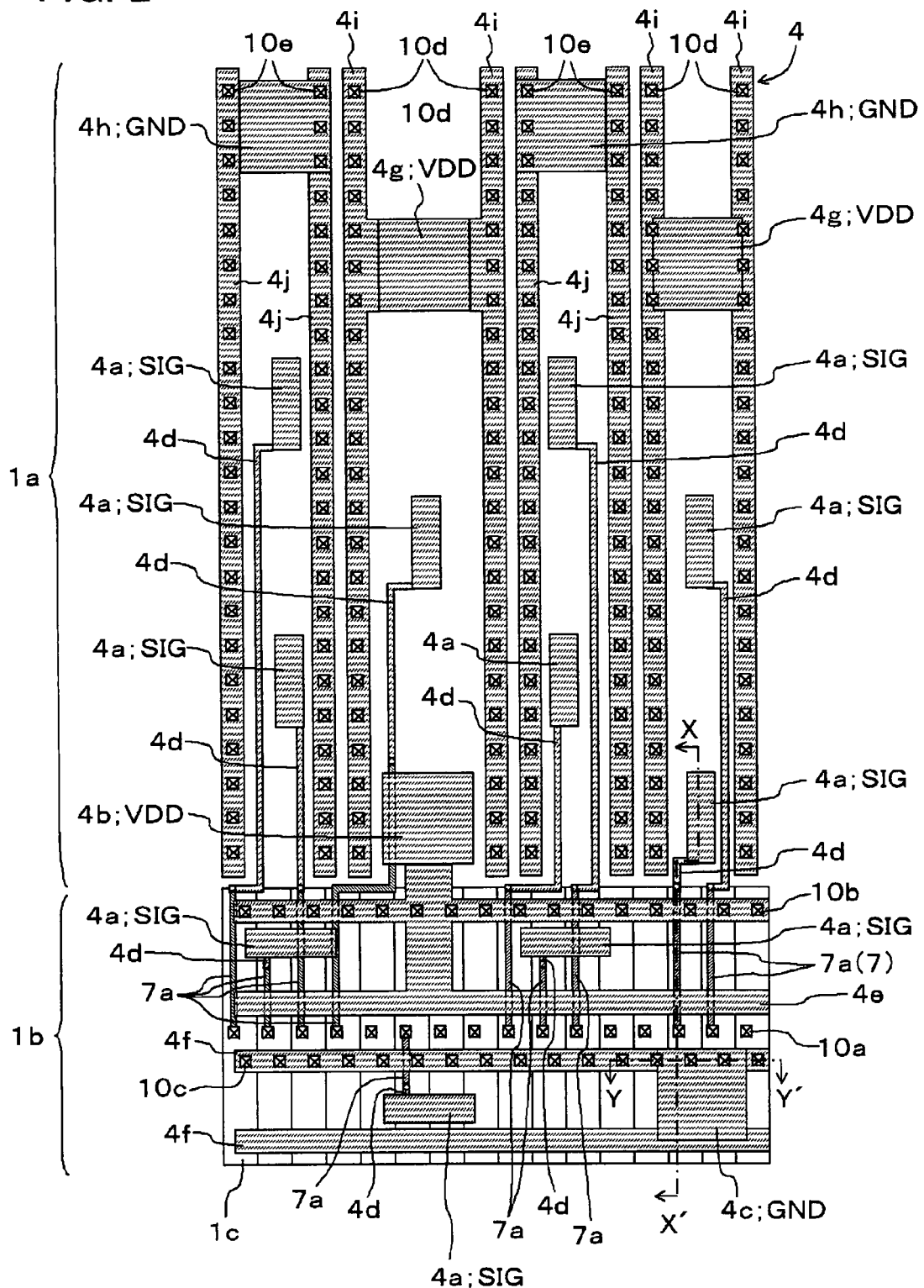
FIG. 2 is a partially enlarged plan view schematically illustrating pads and wiring patterns in a region enclosed by a phantom line in the semiconductor integrated circuit device according to the first example.
Figure 3:
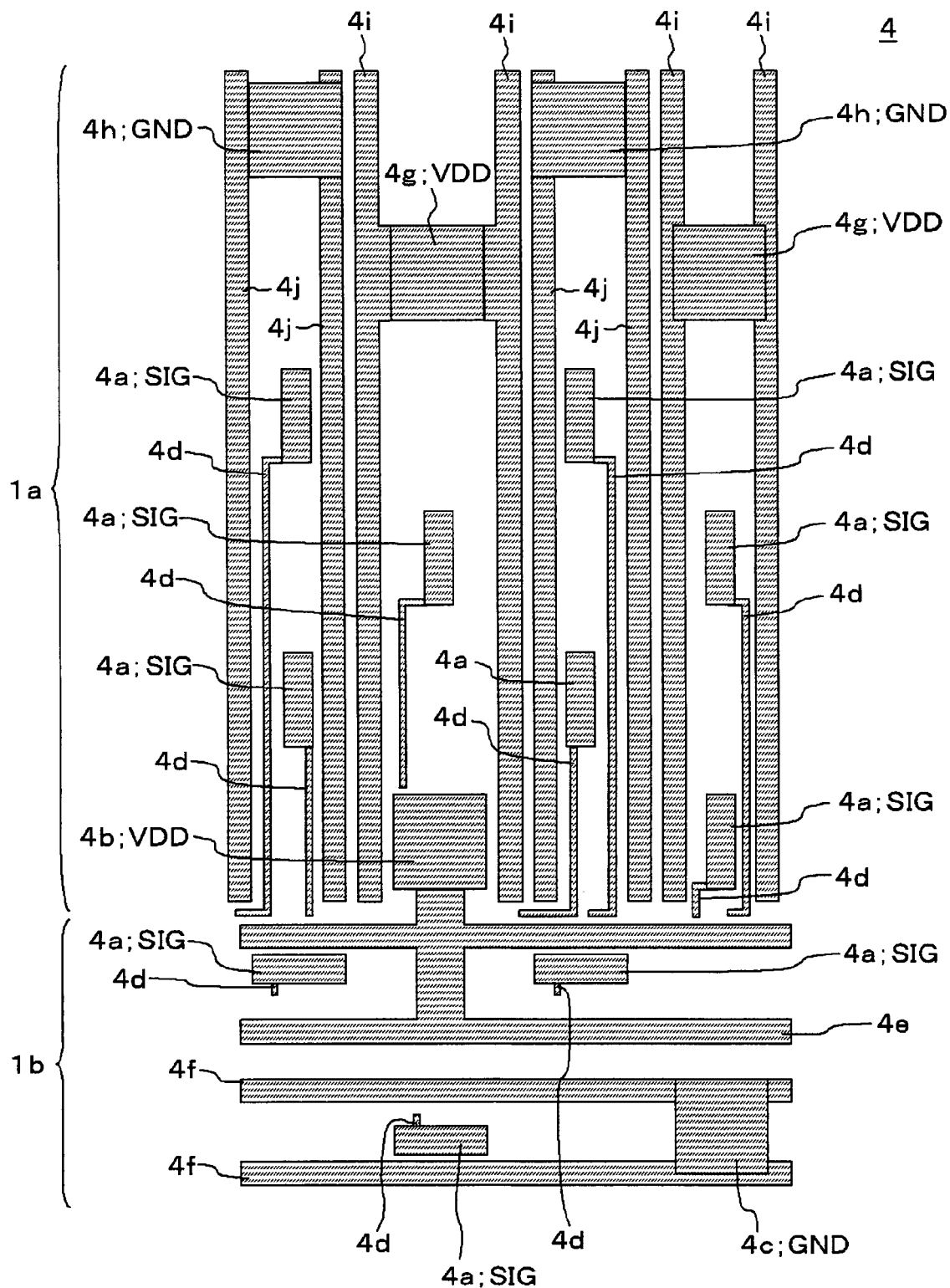
FIG. 3 is a partial plan view schematically illustrating only patterns of an uppermost wiring layer of the semiconductor integrated circuit device according to the first example.

The multi-layered wiring arrangement of the semiconductor integrated circuit device 1 has an uppermost wiring layer 4 and a wiring layer 7, as illustrated in FIG. 2.

Figure 4:
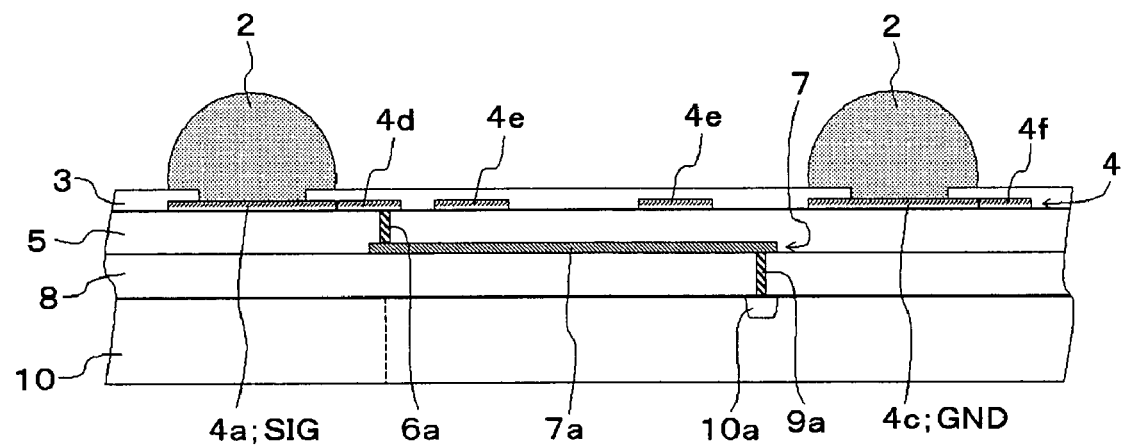
FIG. 4 is a partial sectional view taken along line X-X' of FIG. 2 schematically illustrating the semiconductor integrated circuit device according to the first example.
Figure 5:
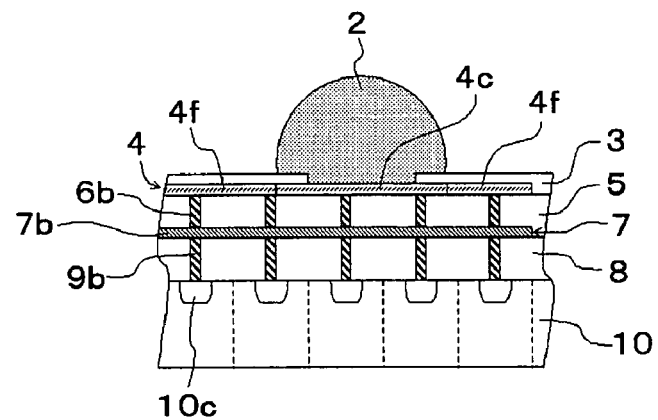
FIG. 5 is a partial sectional view taken along line Y-Y' of FIG. 2 schematically illustrating the semiconductor integrated circuit device according to the first example.
Figure 6:
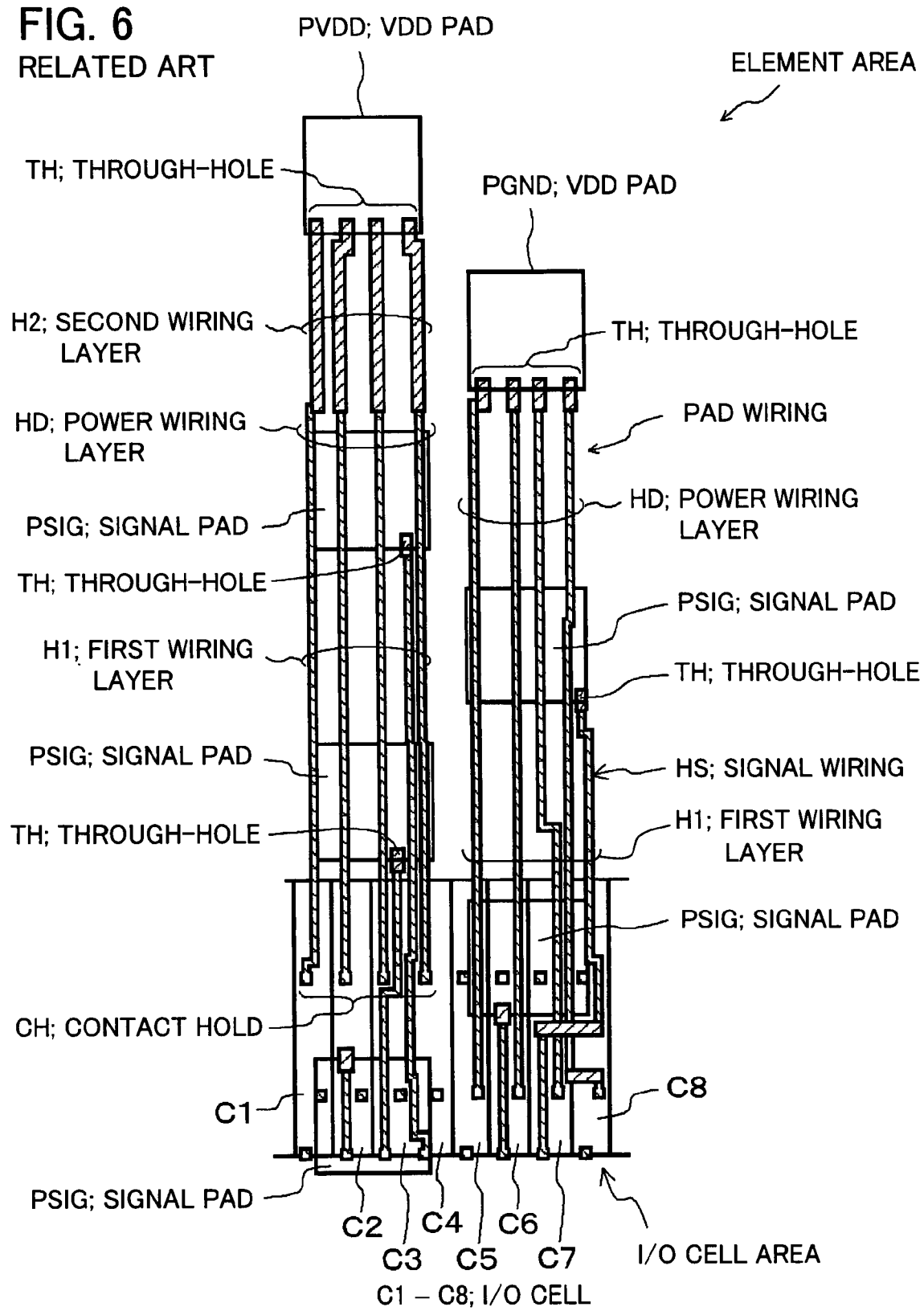
FIG. 6 is a wiring layout view illustrating the connections between I/O cells and pads in a semiconductor integrated circuit device according to an example of the related art.

The uppermost wiring layer 4 is the uppermost layer (toward the side of the bumps) among the multiple wiring layers and is disposed between the insulating layers 3 and 5, as illustrated in FIGS. 4 and 5. The uppermost wiring layer 4 has signal pads 4a, a first VDD pad 4b, a first GND pad 4c, signal wiring 4d, first VDD wiring 4e, first GND wiring 4f, second VDD pads 4g, second GND pads 4h, second VDD wiring 4i and second GND wiring 4j.

The signal pads 4a are signal pads for I/O cells 1c. The signal pads 4a are disposed below bumps 2 (FIG. 1) at prescribed locations among locations marked by the circles on the grid in FIG. 1 in the internal circuit area 1a and I/O cell area 1b. The signal pads 4a are arranged in order from the outer edge of the semiconductor integrated circuit device 1 while the first VDD pad 4b and first GND pad 4c are avoided. The signal pads 4a are constructed as an integral part of the corresponding signal wiring 4d in the same layer, as illustrated in FIG. 3. The signal pad 4a is electrically connected to a diffusion layer 10a, which serves as the signal terminal of the corresponding I/O cell 1c, through the signal wiring 4d, a via 6a, signal wiring 7a and a via 9a, as illustrated in FIG. 4. The signal pad 4a is configured to have a width (along the transverse direction of the pad) smaller than that of the power pads (first VDD pad 4b, first GND pad 4c, second VDD pad 4g, second GND pad 4h). For example, the signal pads 4a can be made polygonal in shape, such as rectangular or octagonal. The reason for this is that only a current smaller than that of the power pads flows through the signal pad 4a. By way of example, the longitudinal direction of the signal pads 4a can be oriented in parallel with the outer edge of the semiconductor integrated circuit device 1 with regard to the signal pad 4a of I/O cell area 1b, while it can be oriented perpendicular to the outer edge of the semiconductor integrated circuit device 1 with regard to the signal pad 4a of internal circuit area 1a, in accordance with the power pads (first VDD pad 4b, first GND pad 4c, second VDD pad 4g, second GND pad 4h) and patterns of the wiring thereof (first VDD wiring 4e, first GND wiring 4f, second VDD wiring 4i and second GND pad 4h). Power wiring (first VDD wiring 4e, first GND wiring 4f, second VDD wiring 4i and second GND wiring 4j) is not disposed directly below the signal pads 4a.

Although the signal pads 4a are small in width, no problems arise because the size thereof is sufficient for the allowable current of the I/O cells. Further, the bumps 2 disposed on the signal pads 4a are of approximately the same size as the bumps 2 disposed on the power pads (first VDD pad 4b, first GND pad 4c, second VDD pad 4g, second GND pad 4h). Further, by using pads having an area of larger width than that of the signal pads 4a as the power pads through which a large current flows, the area of contact with the bumps can be enlarged and hence there is no increase in connection resistance.

The first VDD pad 4b is a VDD-side power pad for the I/O cells 1c. The first VDD pad 4b is disposed below bumps 2 (FIG. 1) at prescribed locations among locations marked by the circles on the grid in FIG. 1 in the internal circuit area 1a. It should be noted that the first VDD pad 4b preferably is disposed at a location in the vicinity of the I/O cell area 1b or inside the I/O cell area 1b. The first VDD pad 4b is constructed as an integral part of the first VDD wiring 4e (VDD bus) in the same layer. The first VDD pad 4b is electrically connected to a first VDD terminal 10b of each I/O cell through the first VDD wiring 4e, a via (not shown; an area that will not interfere with the via 6a in the same layer), VDD wiring (not shown; an area that will not interfere with signal wiring 7a in the same layer) and a via (not shown; an area that will not interfere with the via 9a in the same layer). In consideration of the fact that a large current will flow through it, the first VDD pad 4b is configured to have a width larger than that of the signal pads 4a. For example, the first VDD pad 4b can be made polygonal in shape, such as square or octagonal.

The first GND pad 4c is a GND-side power pad for the I/O cells 1c. The first GND pad 4c is disposed below the bump 2 (FIG. 1) at prescribed locations among locations marked by the circles on the grid in FIG. 1 in the I/O cell area 1b. It should be noted that the first GND pad 4c preferably is disposed at a location in the vicinity of the outer edge of the semiconductor integrated circuit device 1. The first GND pad 4c is constructed as an integral part of the first GND wiring 4f (GND bus) in the same layer. The first GND pad 4c is electrically connected to a diffusion layer 10c, which serves as a first GND terminal of each I/O cell, through the first GND wiring 4f, a via 6b, first GND wiring 7b and a via 9b, as illustrated in FIG. 5. In consideration of the fact that a large current will flow through it, the first GND pad 4c is configured to have a width larger than that of the signal pads 4a. For example, the first GND pad 4c can be made polygonal in shape, such as square or octagonal.

The signal wiring 4d is constructed as an integral part of the corresponding signal pad 4a in the same layer and is mainly disposed in the internal circuit area 1a. The first VDD wiring 4e (VDD bus) is constructed as an integral part of the first VDD pad 4b in the same layer and is mainly disposed in the I/O cell area 1b. The first GND wiring 4f (GND bus) is constructed as an integral part of the first GND pad 4c in the same layer and is mainly disposed in the I/O cell area 1b. The wiring traces of the signal wiring 4d, first VDD wiring 4e and first GND wiring 4f preferably are disposed in the uppermost layer to the greatest extent possible while interference with power pads (first VDD pad 4b, first GND pad 4c, second VDD pad 4g, second GND pad 4h) is avoided. The signal wirings 4d preferably are laid out by automatic routing. Further, although the wiring traces of the first VDD wiring 4e and first GND wirings 4f are laid out as special-purpose patterns, they may be laid out by automatic wiring if possible.

The second VDD pads 4g are VDD-side power pads for the internal circuits. The second VDD pad 4g is disposed below the bump 2 (FIG. 1) at prescribed locations among locations marked by the circles on the grid in FIG. 1 in the internal circuit area 1a. The second VDD pad 4g is constructed as an integral part of the second VDD wiring 4i (VDD bus) in the same layer. The second VDD pad 4g is electrically connected to a second VDD terminal 10d of the internal circuit through the second VDD wiring 4i, a via (not shown; an area that will not interfere with the via 6b in the same layer), VDD wiring (not shown; an area that will not interfere with the GND wiring 7b in the same layer) and a via (not shown; an area that will not interfere with the via 9b in the same layer). It should be noted that the second VDD terminal 10d is disposed directly below or peripheral to the second VDD wiring 4i. In consideration of the fact that a large current will flow through it, the second VDD pad 4g is configured to have a width larger than that of the signal pads 4a. For example, the first VDD pad 4b can be made polygonal in shape, such as square or octagonal.

The second GND pad 4h is a GND-side power pad for the internal circuit. The second GND pad 4h is disposed below the bump 2 (FIG. 1) at prescribed locations among locations marked by the circles on the grid in FIG. 1 in the I/O cell area 1b. The second GND pad 4h is constructed as an integral part of the second GND wiring 4j (GND bus) in the same layer. The second GND pad 4h is electrically connected to a second GND terminal 10e through the second GND wiring 4j, a via (not shown; an area that will not interfere with the via 6b in the same layer), GND wiring (not shown; an area that will not interfere with the GND wiring 7b in the same layer) and a via (not shown; an area that will not interfere with the via 9b in the same layer). It should be noted that the second GND terminal 10e is disposed directly below or peripheral to the second GND wiring 4j. In consideration of the fact that a large current will flow through it, the second GND pad 4h is configured to have a width larger than that of the signal pads 4a. For example, the first VDD pad 4b can be made polygonal in shape, such as square or octagonal.

The second VDD wiring 4i (VDD bus) is configured as an integral part of the second VDD pad 4g in the same layer and is disposed in the internal circuit area 1a. The second GND wiring 4j (GND bus) is configured as an integral part of the second GND pad 4h in the same layer and is disposed in the internal circuit area 1a. The wiring traces of the second VDD wiring 4i and second GND wiring 4j are extended from the pads to the vicinity of the I/O cell area 1b using the uppermost wiring layer 4 in order to reinforce the power supply.

The wiring layer 7 is placed one level below the uppermost wiring layer 4 among the multiple wiring layers and is disposed between the insulating layers 5 and 8, as illustrated in FIGS. 4 and 5. The wiring layer 7 has the first signal wiring 7a, first VDD wiring (not shown), the GND wiring 7b, second VDD wiring (not shown) and second GND wiring (not shown). Each of the wiring traces is for electrically connecting the corresponding wiring of the uppermost wiring layer 4 and terminal.

In the first example illustrated in FIGS. 2 and 3, the power wiring employs the wiring having a width larger than that of the signal wiring. At the time of filing of Patent Document 1, the mixing of wiring traces having different width dimensions resulted in a complicated design flow, and this was an obstacle particularly in terms of advancing automatic design. However, the present inventors have found that if use is made of automatic layout in a case where wiring traces of large and small widths are mixed, as disclosed in the specification of Japanese Patent Kokai Publication No. JP-P2004-350946A (the entire disclosure thereof being incorporated herein by reference thereto), it is possible to implement automatic design using wiring thicker than that of the signal wiring for the power wiring. In particular, reducing the width of the signal pads 4a laid out in the internal circuit area 1a, as illustrated in FIGS. 2 and 3, makes it possible to enlarge the wiring width of the power wiring 4i, 4j for the internal circuits without enlarging the layout area, and a fluctuation in potential in the internal circuits can be reduced.

Further, owing to use of a signal pad of small width also for the signal pad 4a disposed in the I/O cell area 1b, a fluctuation in potential in the I/O cells and internal circuits can be reduced by strengthening the power wiring 4e, 4f for the I/O cells, the signal wiring 4d between the I/O cells and pads, the power wiring 4i for the internal circuits and the signal wiring (not shown) for the internal circuits. An additional effect is that the reliability of EM, etc., is enhanced by strengthening the power wiring.

Further, since the wiring traces of the power wiring 4i, 4j are laid out at right angles to the outer edge of the semiconductor chip in the internal circuit area 1a, the signal pads 4a disposed in the internal circuit area 1a are arranged in such an orientation that the width thereof in the direction parallel to the outer edge of the semiconductor chip is reduced so as to facilitate the routing of the power wiring 4i, 4j. In the I/O cell area 1b, on the other hand, the power wiring 4e, 4f is routed along the outer edge of the semiconductor chip. Accordingly, the signal pad 4a disposed in the I/O cell area 1b is arranged in such an orientation that the width thereof at right angles to the outer edge of the semiconductor chip is reduced so as not to obstruct the routing of the power wiring 4e, 4f.

Further, in FIGS. 4 and 5, the wiring layer underlying the uppermost wiring layer 4 in the multi-layer wiring arrangement is solely the wiring layer 7. However, multiple wiring layers may be disposed below the uppermost wiring layer 4. Furthermore, in FIGS. 2 and 3, it is also possible to use the vacant area in the uppermost layer to strengthen the power wiring. Further, although the bumps are illustrated as being formed by solder holes in the first example, it goes without saying that a suitable material can be selected as the material constituting the bumps.

Further, in FIGS. 2 and 3, pad sizes of two types are employed in accordance with the allowable amount of current. However, pads of a larger number of sizes may be used.

The first example affords a number of meritorious effects, which will now be described.

First, wireability (wiring ability) is improved. In other words, by using pads having a width less than that of the power pads (the first VDD pad 4b, first GND pad 4c, second VDD pad 4g, second GND pad 4h) for the signal pads 4a, the wireable area between the signal pads 4a in the uppermost wiring layer 4 is enlarged and wireability enhanced. Further, by placing the power pads (first VDD pad 4b and first GND pad 4c) for the I/O cells 1c in the vicinity of the I/O cell area 1b or in a region within the I/O cell area 1b, pressure upon the wireable area between signal pads 4a is relieved and wireability improved.

Second, the number of wiring layers can be reduced. In other words, by using pads having a width less than that of the power pads (the first VDD pad 4b, first GND pad 4c, second VDD pad 4g, second GND pad 4h) for the signal pads 4a, it becomes possible to lay out the signal wiring 4d using mainly the uppermost wiring layer 4 in the internal circuit area 1a. The frequency of use of the signal wiring 7a in the wiring layer 7 one level below the uppermost wiring layer 4 is reduced in the internal circuit area 1a (even if used it is only in the I/O cell area 1b and vicinity thereof), and a reduction in the height of the layers can be achieved. Further, since the wiring layer one level below the uppermost wiring layer is a strong wiring layer whose role is to strengthen the power supply, the wiring layer one level below the uppermost wiring layer can also be eliminated if power can be supplied by another wiring layer.

Third, strengthening of the power supply of the I/O cells 1c and a reduction in power supply noise can be achieved. The reason for this is that by placing the power pads (first VDD pad 4b and first GND pad 4c) on or in the vicinity of the I/O cells 1c, wiring resistance between the power pads can be minimized.

Fourth, strengthening of the power supply of the internal circuits and a reduction in power supply noise can be achieved. The reason for this is that by using pads having a width less than that of the power pads (the first VDD pad 4b, first GND pad 4c, second VDD pad 4g, second GND pad 4h) for the signal pads 4a, a wiring area for supplying the power of the internal circuits can be acquired.

Degree of freedom of macro placement below the signal pads 4a in the internal circuit area 1a is enhanced. The reason for this is that since the signal wiring 4d is formed using mainly the uppermost wiring layer 4 in the internal circuit area 1a and the frequency of use of the signal wiring 7a in the wiring layer 7 is reduced, the area in which placement of a macro below the signal pads 4a in the internal circuit area 1a is enlarged.

As many apparently widely different examples of the present invention can be made without departing from the spirit and scope thereof, it is to be understood that the invention is not limited to the specific examples thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
   a plurality of power pads placed on a semiconductor chip; and
   a plurality of signal pads placed on the semiconductor chip and configured to have a width less than that of said power pads, wherein the plurality of signal pads include a first signal pad positioned in a first direction and a second signal pad positioned in a second direction different from the first direction.

2. The device according to claim 1, wherein said power pads are square pads and said signal pads are rectangular pads.

3. The device according to claim 1, wherein the semiconductor chip has I/O cells and internal circuits;
   said power pads include first power pads for said I/O cells and second power pads for said internal circuits;

said first power pads are placed on or in the vicinity of said I/O cells; and said second power pads are placed on said internal circuits.

4. The device according to claim 3, wherein said internal circuits are placed at the center of the semiconductor chip, and said I/O cells are placed in the vicinity of an outer edge of the semiconductor chip.

5. The device according to claim 1, wherein said signal pads and said power pads are placed in an uppermost wiring layer among a plurality of wiring layers.

6. The device according to claim 3, wherein at least one portion of signal wiring electrically connecting said I/O cells and said signal pads is placed in the uppermost wiring layer.

7. The device according to claim 3, wherein at least one portion of first power wiring electrically connecting said I/O cells and said first power pads is placed in the uppermost wiring layer.

8. The device according to claim 3, wherein at least one portion of second power wiring electrically connecting said internal circuits and said second power pads is placed in the uppermost wiring layer.

9. The device according to claim 4, wherein said signal pads are placed in order starting from the vicinity of the outer edge of the semiconductor chip while said first power pads are avoided.

10. The device according to claim 1, further comprising a plurality of bumps disposed on respective ones of said power pads and said signal pads;

wherein said bumps are approximately the same in size.

11. The device according to claim 7, wherein the portion of the first power wiring placed in the uppermost wiring layer is routed along the outer edge of the semiconductor chip; and at least some of said signal pads are pads that are placed on said I/O cells and that have a width of diminished size in a direction at right angles to the outer edge of the semiconductor chip.

12. The device according to claim 8, wherein at least a portion of the second power wiring placed in the uppermost wiring layer is routed in a direction at right angles to the outer edge of the semiconductor chip; and at least some of the signal pads are pads that are placed between wiring traces of the second power wiring on the internal circuits and that have a width of diminished size in a direction parallel to the outer edge of the semiconductor chip.

13. The device according to claim 1, further comprising a pair of power wiring traces routed in parallel in the same direction from both ends of two opposing sides of one power pad from among the plurality of power pads;

wherein said first signal pad is interposed between said pair of power wiring traces; and said first signal pad has a width that is smaller than spacing between said first pair of power wiring traces.

14. The device according to claim 13, wherein said second signal pad is interposed between one wiring trace among said pair of power wiring traces and placed in an area that does not interfere with said first signal pad;

said second signal pad is connected to second signal wiring;

said plurality of power pads, said first and second signal pads, said pair of power wiring traces and said second signal wiring are arranged using the same wiring layer; and said second signal wiring is a wiring that passes between said first signal pad and said pair of power wiring traces.

15. The device according to claim 13, wherein the spacing between said pair of power wiring traces is less than a spacing between the two opposing sides of said power pad.

16. The device according to claim 1, wherein the first signal pad is positioned perpendicular to the second signal pad.

17. The device according to claim 1, wherein the semiconductor chip includes I/O cells and internal circuits;

said first signal pad corresponding to the I/O cells; and said second signal pad corresponding to the internal circuits.

18. The device according to claim 17, wherein the first signal pad is positioned perpendicular to the second signal pad.

* * * * *